(12) United States Patent
Chien et al.

(10) Patent No.: US 6,403,417 B1
(45) Date of Patent: Jun. 11, 2002

(54) METHOD FOR IN-SITU FABRICATION OF A LANDING VIA AND A STRIP CONTACT IN AN EMBEDDED MEMORY

(75) Inventors: Sun-Chieh Chien; Chien-Li Kuo, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/803,881

(22) Filed: Mar. 13, 2001

(51) Int. Cl.[7] .......................................... H01L 21/8242
(52) U.S. Cl. ...................... 438/241; 438/258; 438/275; 438/279
(58) Field of Search ................................ 438/241, 258, 438/275, 279

(56) References Cited

U.S. PATENT DOCUMENTS 5,320,976 A * 6/1994 Chin et al. .................. 438/241
6,281,067 B1 * 8/2001 Chien et al. ................. 438/241
6,287,911 B1 * 9/2001 Nobusawa ................... 438/241

* cited by examiner

Primary Examiner—John F. Niebling
Assistant Examiner—Jennifer M. Kennedy
(74) Attorney, Agent, or Firm—Winston Hsu

(57) ABSTRACT

The present invention provides a method to integrate the process of manufacturing an embedded memory and the sequential process of forming a landing via and a strip contact in the embedded memory. The method involves first defining a memory array region and a periphery circuit region on the surface of a silicon substrate of a semiconductor wafer. Next, a plurality of gates and lightly doped drains are separately formed in the memory array region and the periphery circuit region. A silicon nitride layer then covers the surface of each gate in the memory array region, and forms a spacer on either side of each gate in the periphery circuit region. Then, a dielectric layer is formed on the surface of the semiconductor wafer, and a landing via hole and a strip contact hole are separately formed in the dielectric layer in the memory array region and the periphery circuit region, respectively. Finally, each hole is filled with a conductive layer to form in-situ each landing via and strip contact.

18 Claims, 13 Drawing Sheets

METHOD FOR IN-SITU FABRICATION OF A LANDING VIA AND A STRIP CONTACT IN AN EMBEDDED MEMORY

FIELD OF THE INVENTION

The present invention relates to a method for integrating the process of manufacturing an embedded memory and the process of manufacturing a landing via and a strip contact in the embedded memory, and more particularly, to a method for decreasing the occupied space of a strip contact in a memory device.

DESCRIPTION OF THE PRIOR ART

Due to continued improvement in process integration, it is the present trend of the semiconductor industry to fabricate semiconductor integrated circuits that integrate both a memory cell array and high-speed logic circuit elements onto a single chip to form an embedded memory. The embedded memory simultaneously combines the memory arrays and logic circuits to greatly reduce the circuit area and to increase signal processing speed. To avoid short-circuiting of various devices in the embedded memory, after the formation of MOS transistors an insulation layer is formed and covers the surface of the semiconductor wafer. Then, a photo-etching-process (PEP) is used to form a plurality of contact holes. A conductive layer is filled into the contact holes to allow for electrical connection of each metal-oxide-semiconductor (MOS) transistor with the circuit.

Please refer to FIG. 1 to FIG. 11. FIG. 1 to FIG. 11 are cross-sectional diagrams of a prior art method for manufacturing a metal-oxide-semiconductor (MOS) transistor of an embedded memory on a semiconductor wafer 10. As shown in FIG. 1, the surface of the silicon substrate 12 is divided into a memory array area 14 and a periphery circuit region 16. The memory array area 14 contains a cell well 18, and the periphery circuit region 16 contains at least one N-well 20 and at least one P-well 22. Each region is separated by several shallow trench isolation structures 23.

The prior art method first involves forming a gate oxide layer 21, a polysilicon layer 24, a polycide layer 26 and a cap layer 28 composed of silicon nitride, respectively, on the surface of the semiconductor wafer 10. Then, as shown in FIG. 2, a photoresist layer 30 is formed above the cap layer 28 followed by the use of a lithographic process to simultaneously define gate patterns of the memory array area 14 and the periphery circuit region 16 in the photoresist layer 30. Thereafter, the patterned photoresist layer 30 is used as a mask layer to perform an etching process for removing the cap layer 28, the polycide layer 26 and the polysilicon layer 24 down to the surface of the gate oxide layer 21 so as to simultaneously form a plurality of gates 32 above the cell well 18 of the memory array area 14 and a plurality of gates 34 above both the N-well 20 and the P-well 22 of the periphery circuit region 16.

As shown in FIG. 3, the photoresist layer 30 above the cap layer 28 is completely removed followed by performing an ion implantation process to form a doped region (not shown) on the surface of the silicon substrate 12 adjacent to the gates 32, 34. Thereafter, a rapid thermal process (RTP) is performed to drive dopants in the doped region into the silicon substrate 12 so as to form lightly doped drains (LDD) 36 of each MOS transistor.

As shown in FIG. 4, a silicon nitride layer (not shown) is deposited on the semiconductor wafer 10 followed by the use of an an-isotropic etching process to etch back portions of the silicon nitride layer to form a spacer 38 around each gate 32, 34 of the memory array area 14 and the periphery circuit region 16, respectively. Then, an ion implantation process is performed to form a source and drain of each MOS transistor in the periphery circuit region 16. A photoresist layer (not shown) is first formed to cover the memory array area 14 and gates 32, 34 of the N-well 20. Then, N-type dopants are used to implant the surface of the P-well 22 so as to form a doped region 42, followed by the removal of the photoresist layer. Next, another photoresist layer (not shown) is formed to completely cover the memory array area 14 and the gate 34 of the P-well 22. Then, P-type dopants are used to implant the N-well 20 of the periphery circuit region 16 so as to form a doped region 40. Thereafter, a rapid thermal process is used to drive dopants of each doped region 40, 42 into the silicon substrate 12 so as to form the source and the drain of each MOS transistor in the periphery circuit region 16.

As shown in FIG. 5, a salicide block (SAB) layer 44 is formed on the silicon substrate 12 of the memory array area 14. Then, a self-aligned silicide process is performed in the periphery circuit region 16 for forming a salicide layer 46 on the surface of each source and drain so as to finish the process of manufacturing a MOS transistor of an embedded memory according to the prior art.

After the formation of the MOS transistor of an embedded memory, a landing via and a local interconnection of the embedded memory are formed on the semiconductor wafer 10. As shown in FIG. 6, a dielectric layer 48, such as a silicon oxide layer, is first formed on the surface of the semiconductor wafer 10. A photolithographic process is then used to define a landing via hole 50 and contact holes 51a, 51b in the dielectric layer 48, as shown in FIG. 7. The contact hole 51a connects to the gate of MOS transistor 34 and the contact hole 51b connects to a source or drain of another MOS transistor. Therefore, contact holes 51a, 51b are not located on the same vertical cross section.

As shown in FIG. 8, a glue layer or barrier layer 52 and a metal layer 54 are formed, respectively, on the silicon substrate 12 and fill both the landing via hole 50 and the contact holes 51a, 51b. The glue layer or barrier layer 52 and the metal layer 54 are, respectively, composed of titanium, or titanium nitride and tungsten metal. Thereafter, as shown in FIG. 9, the dielectric layer 48 is used as an etching stop layer for chemical mechanical polishing (CMP) of the metal layer 54 so as to form a landing via 55 and contact plugs 56a, 56b. Next, as shown in FIG. 10, a metal conductor layer 57 is formed on the semiconductor wafer 10, followed by the formation of a patterned photoresist layer 58 on the metal conductor layer 57 to define patterns of metal conductors. The metal conductor layer 57 is composed of aluminum (Al), copper (Cu) or aluminum copper alloy. Finally, as shown in FIG. 11, an etching process is performed to remove the metal conductor layer 57 not covered by the photoresist layer 58 so as to form metal conductors 59a, 59b connecting to the landing via 55 and contact plugs 56a, 56b, respectively. The metal conductor 59b, electrically connects the gate of the MOS transistor 34 with a source or drain of another MOS transistor, and together with the contact plugs 56a, 56b forms a local interconnection.

However, in the disclosure of the prior art method for fabricating an embedded memory, in order to simultaneously form gates in both the periphery circuit region and the memory array area, the electrical properties of the periphery circuit region is taken into account whereby a polycide layer is directly deposited on the polysilicon layer for reducing the resistance of the gate structure in the periphery circuit region. A self-aligned silicide operation is also used to form a salicide layer on each source and drain for reducing the contact interface resistance of the MOS transistors. Generally speaking, the polycide layer formed by deposition has a greater resistivity than that of the salicide layer. Hence, the electrical performance of the gate structure composed of both the polycide layer and a cap layer in the periphery circuit region differs with that of the gate structure composed of the salicide layer in the conventional periphery circuit region to result in the unfitness of the cell library established by logic circuits. Secondly, after the formation of the MOS transistor of an embedded memory according to the prior art method, the landing via and local interconnection of the embedded memory are fabricated separately. Thus, at least four photomasks are needed in the prior art process, leading to a costly and complicated process.

SUMMARY OF THE INVENTION

It is therefore a primary objective of the present invention to provide a method for integrating the process of manufacturing an embedded memory and the process of manufacturing a landing via and a strip contact in the embedded memory, to simplify the complexity and decrease the cost of the process. As well, the strip contact of the present invention efficiently reduces the occupied space in the memory cell, to therefore reduce the volume of the unit memory.

The method of the present invention involves first defining a memory array region and a periphery circuit region on the semiconductor wafer. Then, a plurality of gates and lightly doped drains (LDD) are formed in the memory array region and periphery circuit region. Next, silicon nitride is deposited to cover the surface of each gate in the memory array region, followed by the formation of a spacer adjacent to each gate in the periphery circuit region. A dielectric layer is then formed on the surface of the semiconductor wafer and a landing via hole and a strip contact hole are formed in the dielectric layer in the memory array region and the periphery circuit region, respectively. Finally, a conductive layer is filled into each hole to simultaneously form each landing via and strip contact.

The present invention method integrates the process of manufacturing an embedded memory and the sequential process of forming a landing via and a strip contact in the embedded memory, so the complexity and the cost are significantly decreased. Moreover, the present invention combines the area connecting a gate and the area connecting a source or drain in the strip contact of the periphery circuit region to form a single conductive line. Thus, the occupation of space by the strip contact is largely reduced to increase integration.

These and other objectives of the present invention will no doubt become obvious to those of ordinary skill in the art after reading the following detailed description of the preferred embodiment, which is illustrated in the various figures and drawings.

DESCRIPTION OF THE PREFERRED EMBODIMENT

Figure 1:
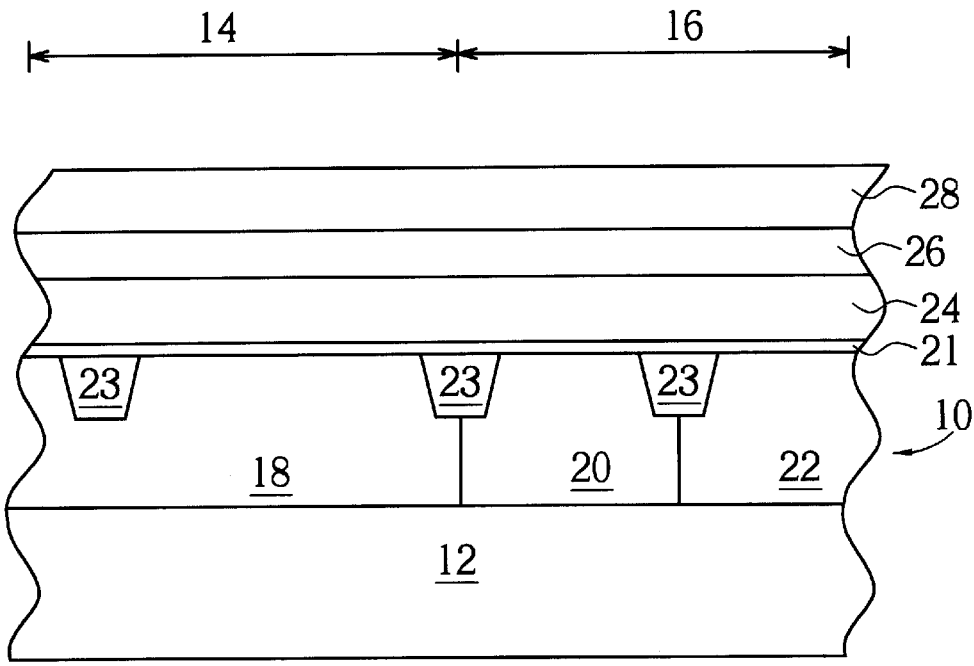
FIG. 1 to FIG. 11 are schematic diagrams of fabricating an embedded memory according to the prior art.
Figure 2:
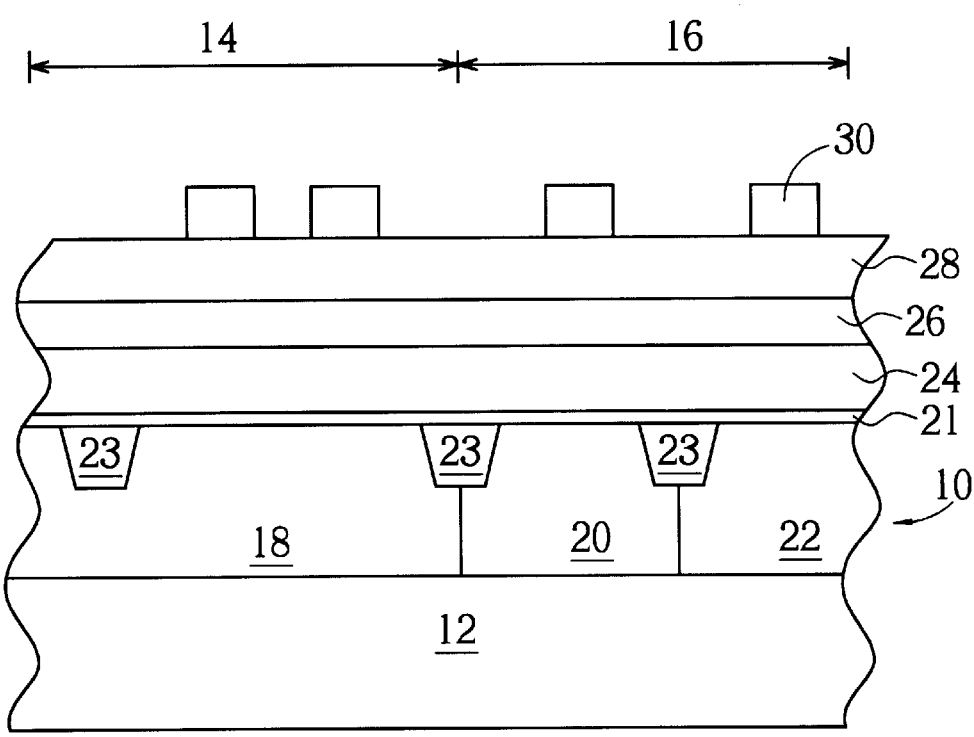
Figure 3:
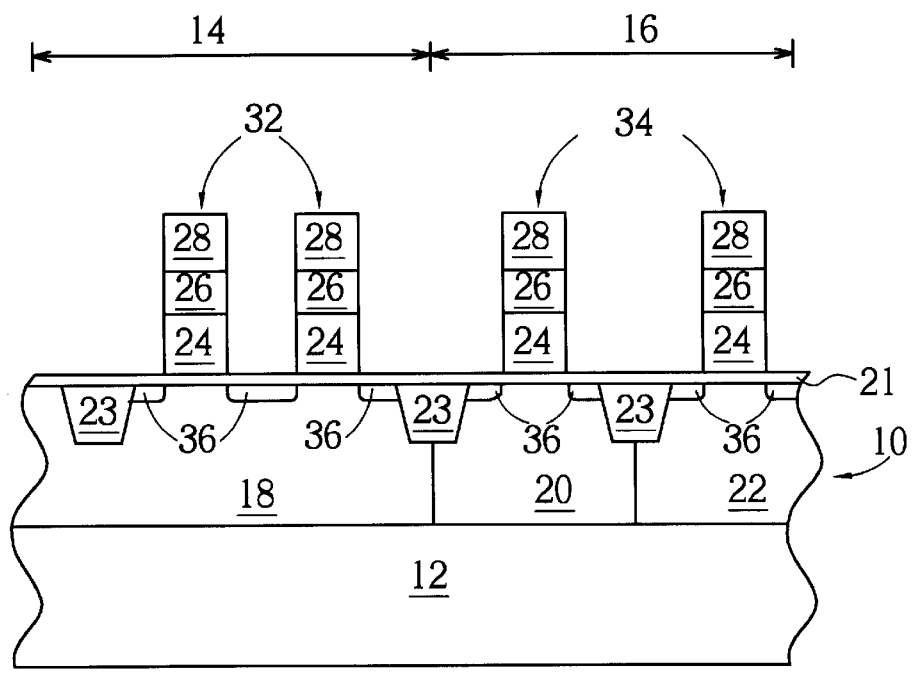
Figure 4:
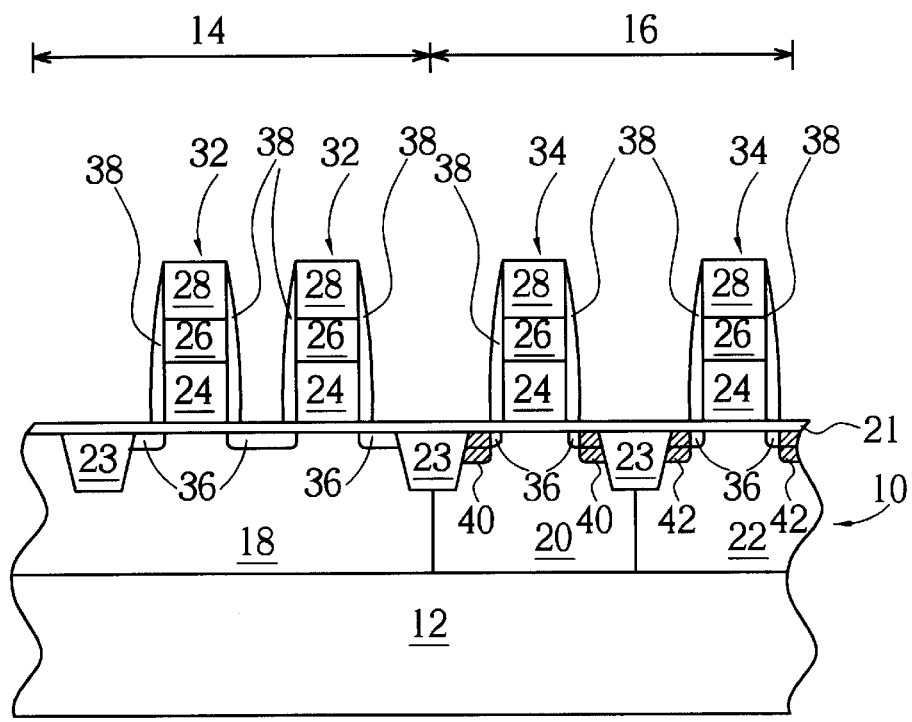
Figure 5:
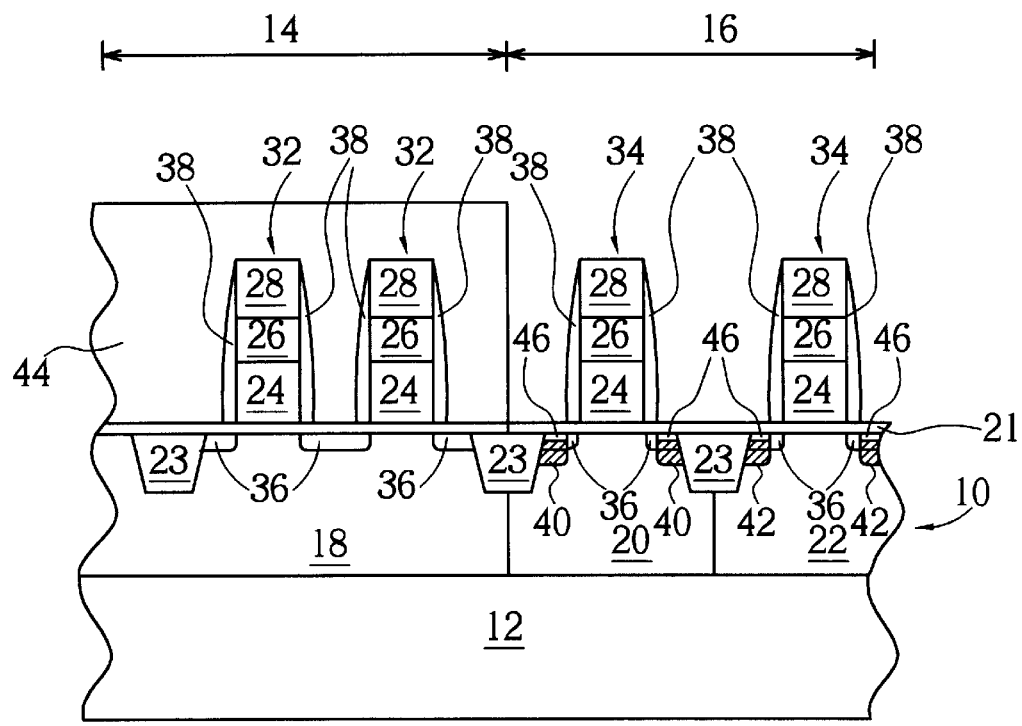
Figure 6:
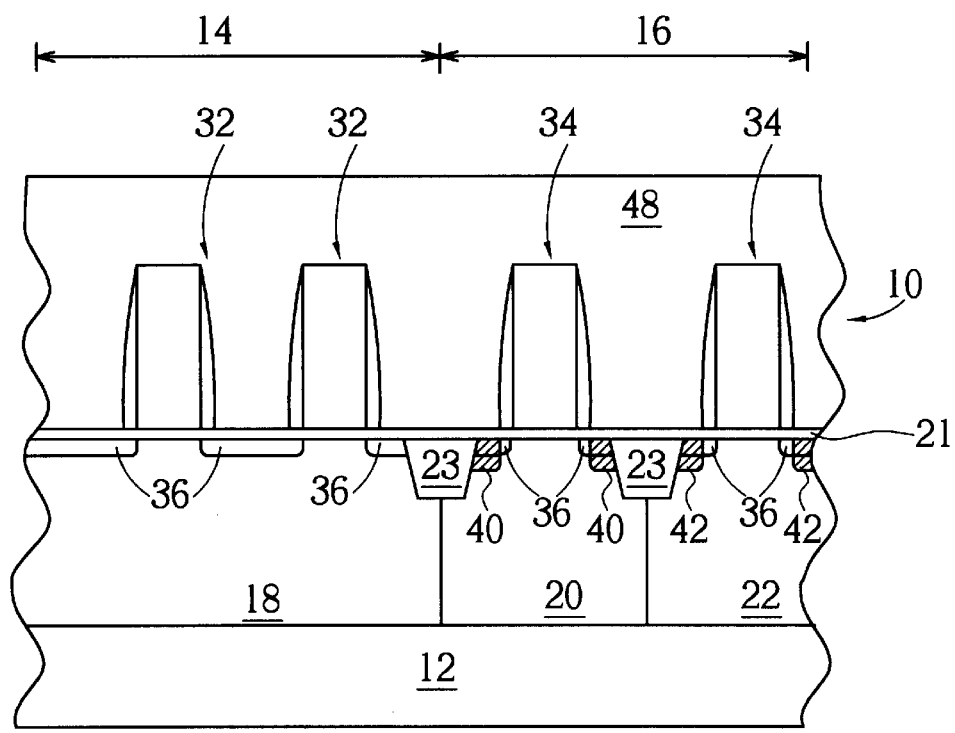
Figure 7:
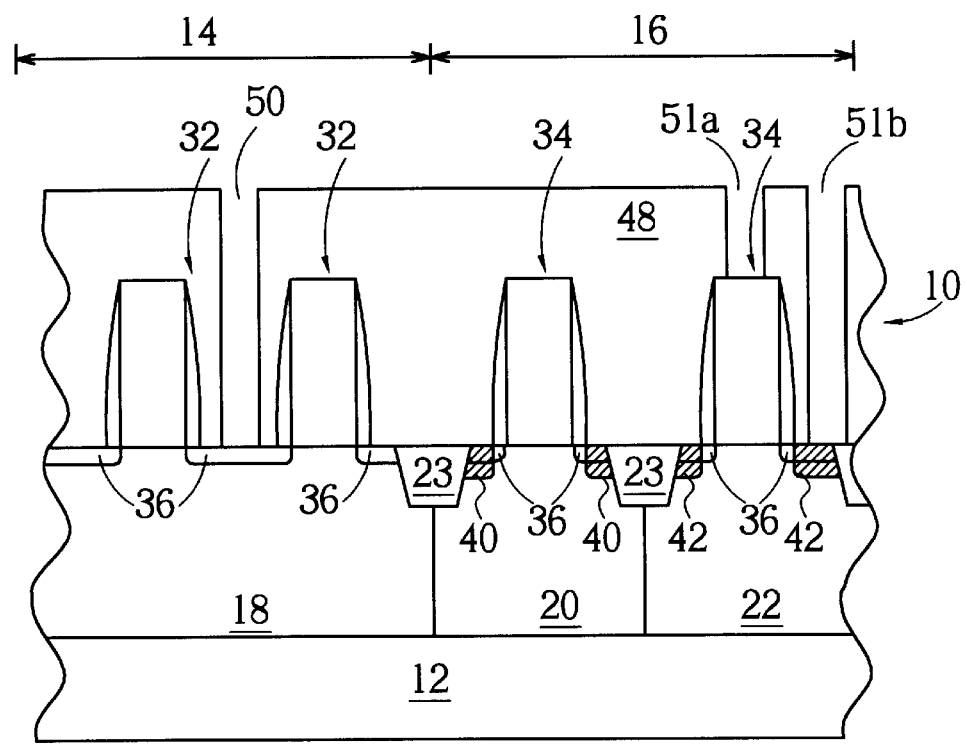
Figure 8:
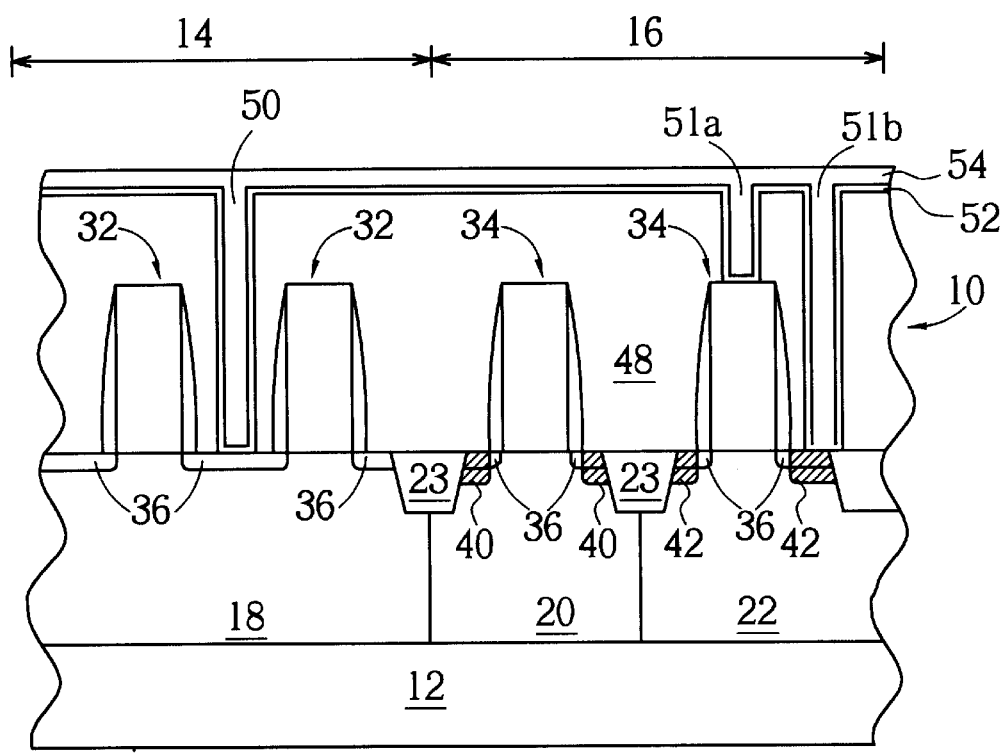
Figure 9:
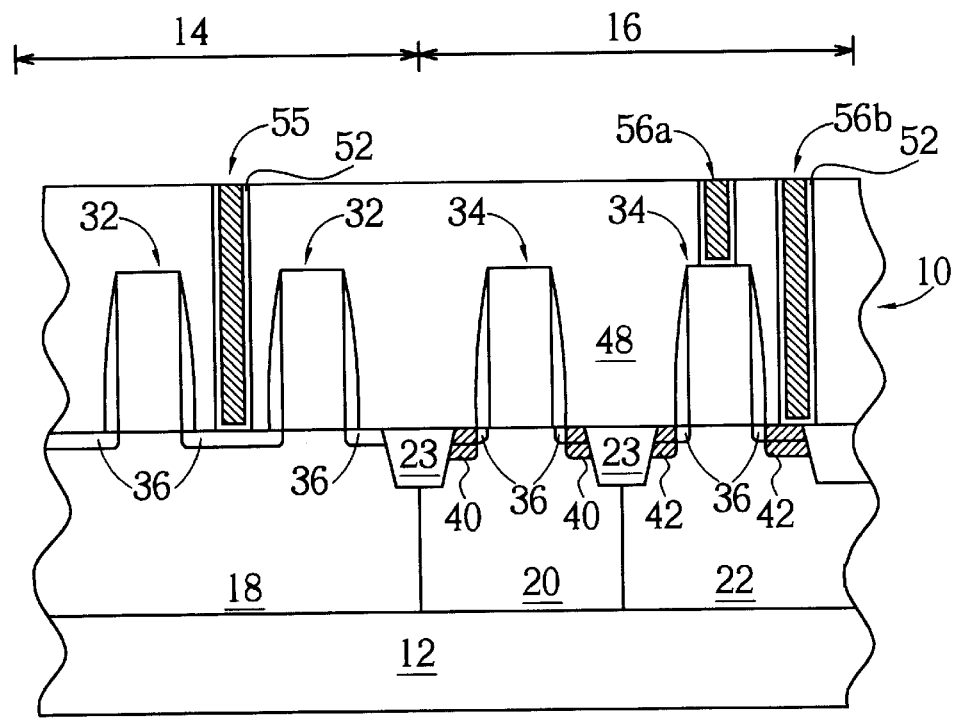
Figure 10:
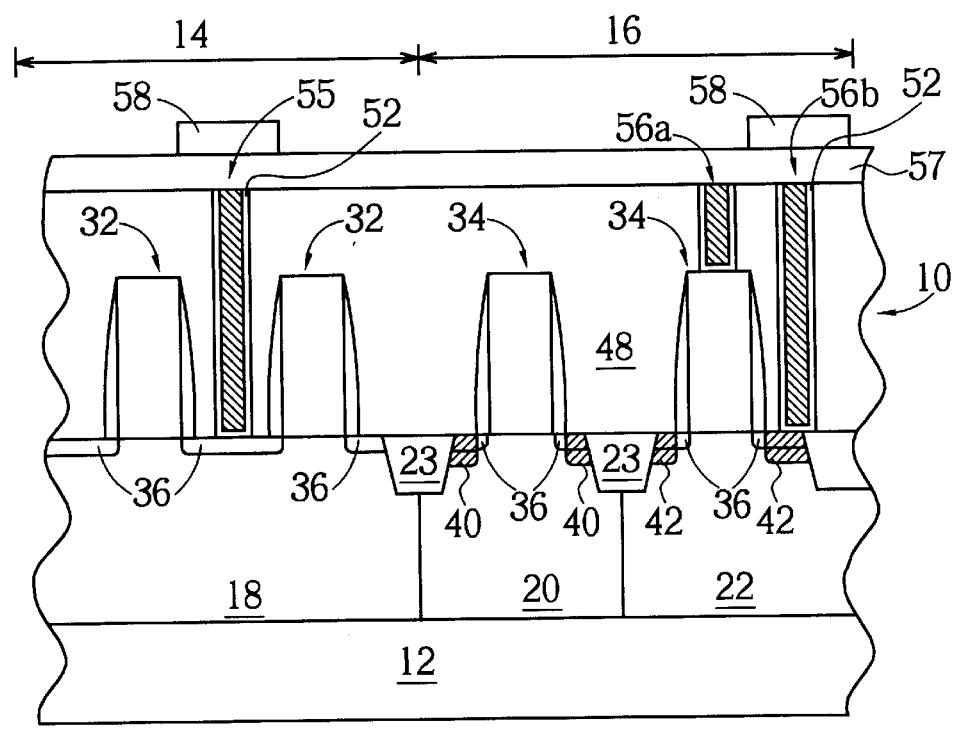
Figure 11:
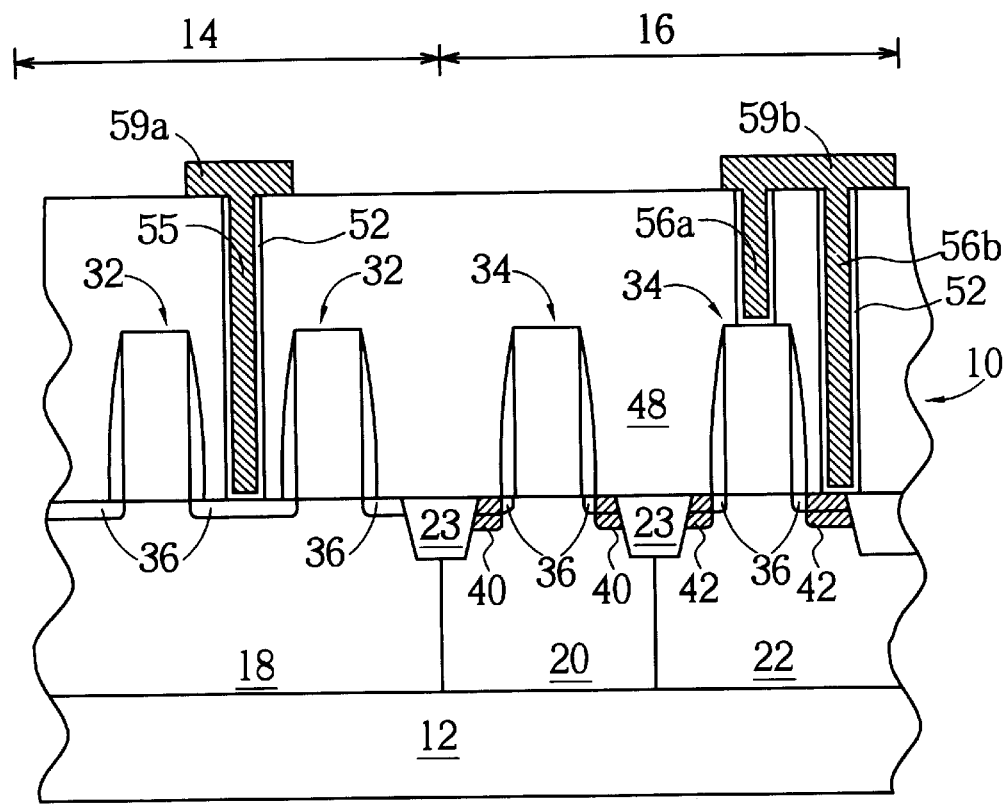
Figure 12:
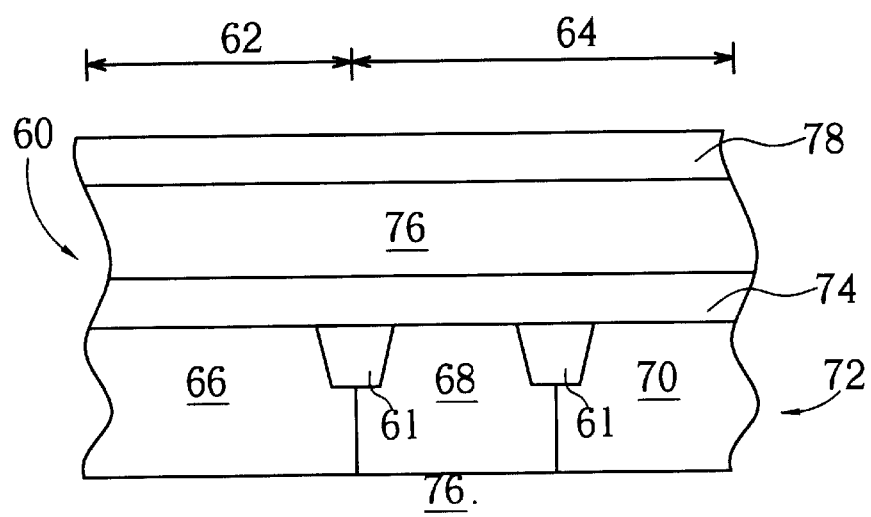
FIG. 12 to FIG. 26 are schematic diagrams of fabricating a landing via and strip contact in an embedded memory according to the present invention.

Please refer to FIG. 12 to FIG. 26. FIG. 12 to FIG. 26 are schematic diagrams of in-situ fabricating a landing via and strip contact of an embedded memory on a semiconductor wafer 60 according to the present invention. As shown in FIG. 12, a semiconductor wafer 60 has both a memory array region 62 and a periphery circuit region 64 defined on the surface of a silicon substrate 72. The memory array region 62 comprises at least a cell-well 66, and the periphery circuit region 64 comprises at least a N-well 68 and at least a P-well 70. Several shallow trench isolation (STI) structures 61 are formed to separate each region.

Figure 13:
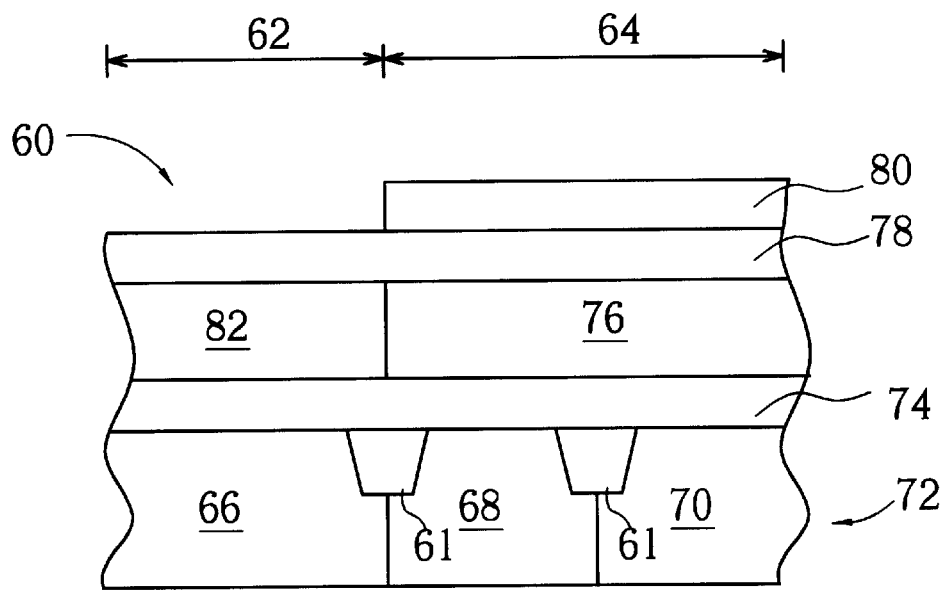

The present invention involves first forming a first dielectric layer 74, an undoped polysilicon layer 76, and a dielectric layer 78, respectively, on the surface of the semiconductor wafer 60. Then, as shown in FIG. 13, a mask layer 80 is formed on the dielectric layer 78 in the periphery circuit region 64. An N-type ion implantation process is performed on the undoped polysilicon layer 76 in the memory array region 62 to subsequently become an N-type doped polysilicon layer 82.

Figure 14:
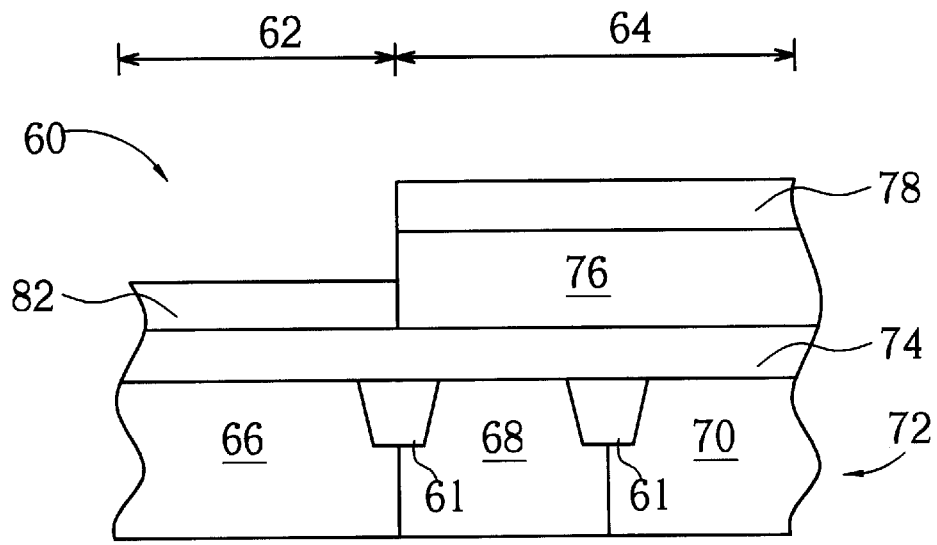
Figure 15:
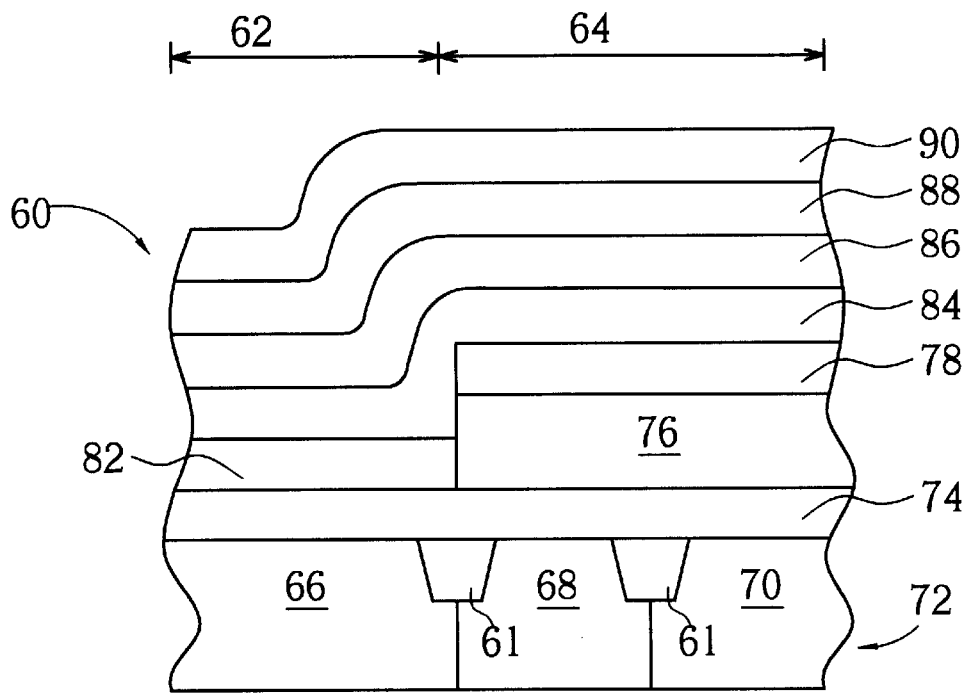

Thereafter, as shown in FIG. 14, an etching process is performed to completely remove the dielectric layer 78 in the memory array area 62, as well as to etch the doped polysilicon layer 82 down to approximately half the total depth of the undoped polysilicon layer 76, or about 1000~1900 Å. As shown in FIG. 15, after removing the mask layer 80 on the periphery circuit region 64, a silicide layer 84, a silicon-oxy-nitride ($SiO_xN_y$) layer 86, a silicon nitride layer 88, and a photoresist layer 90 are formed, respectively, on the surface of the semiconductor wafer 60. The silicide layer 84 is formed to reduce the contact interface resistance of the doped polysilicon layer 82, the silicon-oxy-nitride ($SiO_xN_y$) layer 84 is an anti-reflection coating (ARC) layer, and the silicon nitride layer 88 serves as a protection layer.

Figure 16:
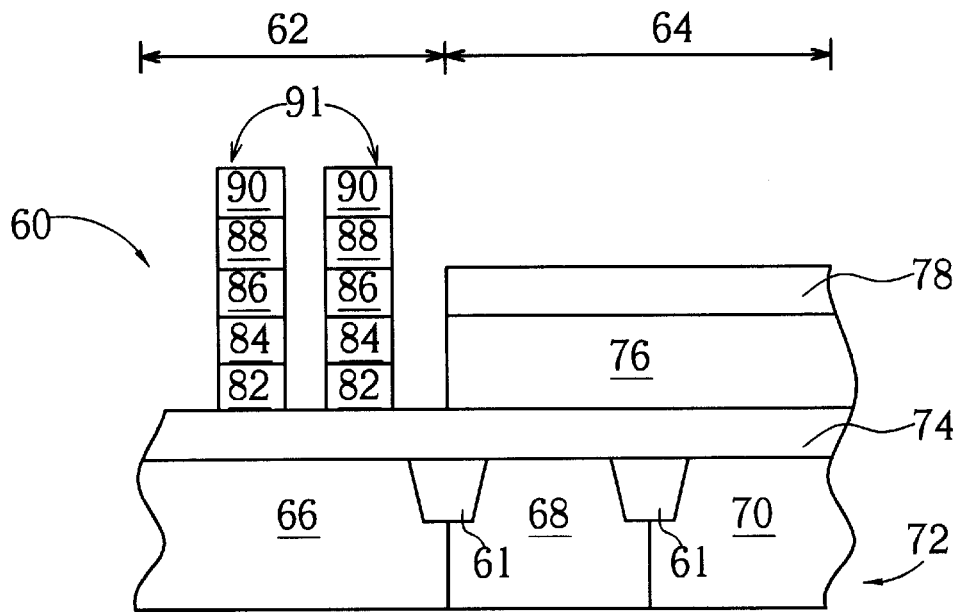

A photolithographic process is performed so as to define a pattern of plurality of gates 91 in the photoresist layer 90 above the cell-well 66 of the memory array region 62. As shown in FIG. 16, the pattern of the photoresist layer 90 is used as a hard mask to etch the silicon nitride layer 88, the silicon-oxy-nitride layer 86, the silicide layer 84, and the doped polysilicon layer 82 positioned in the memory array area 62 down to the surface of the dielectric layer 74. Thus, a plurality of MOS transistor gates 91 are formed in the memory array area 62. An in-situ etching of the silicon nitride layer 88, the silicon-oxy-nitride layer 86 and the silicide layer 84 in the periphery circuit region 64 is performed down to the surface of the dielectric layer 78.

Figure 17:
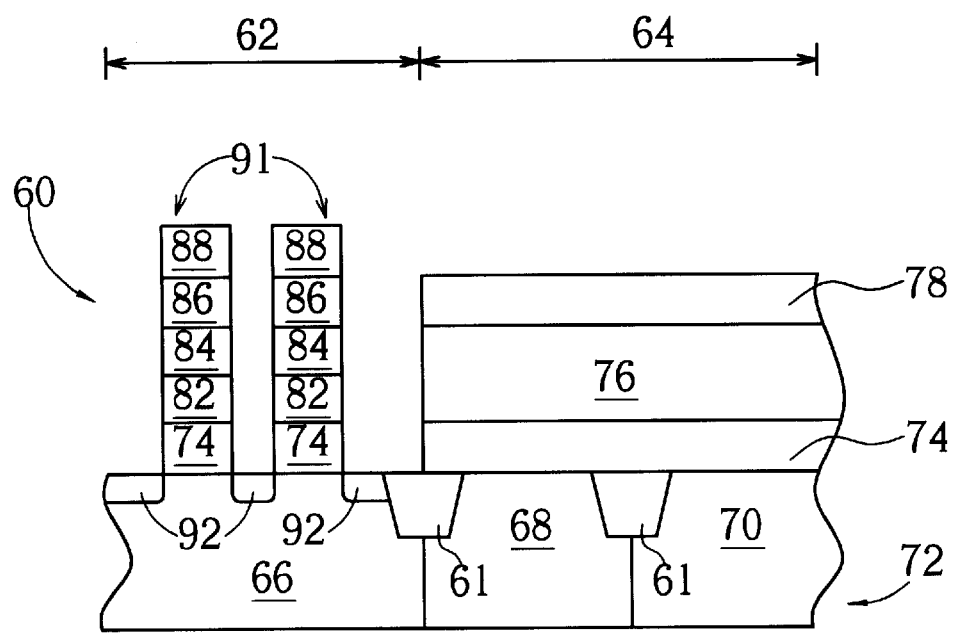
Figure 18:
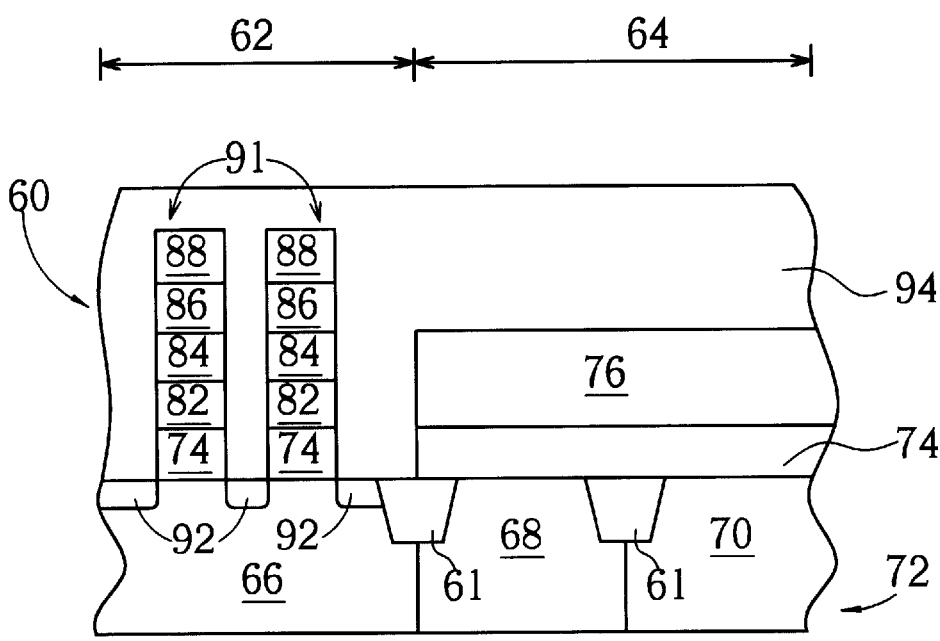
Figure 19:
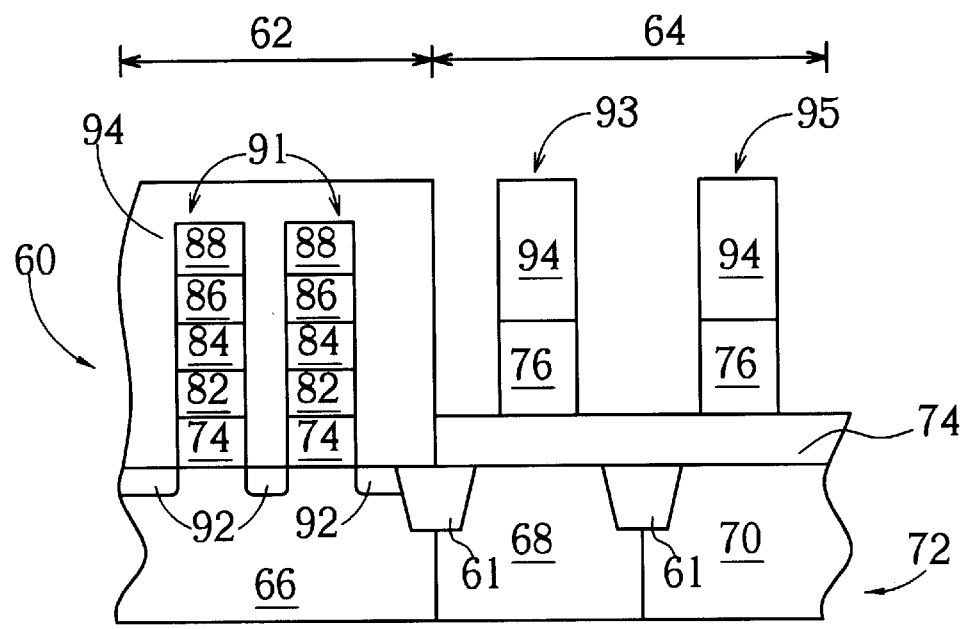

Then, as shown in FIG. 17, an ion implantation process is performed to form lightly doped drains (LDD) 92 for each MOS transistor in the memory array region 62, followed by the removal of the photoresist layer 90. As shown in FIG. 18, after removing the photoresist layer 90, the dielectric layer 78 in the periphery circuit region 64 is also removed. A photoresist layer 94 and a silicon-oxy-nitride layer (not shown) are formed on the surface of the semiconductor wafer 60. The silicon-oxy-nitride layer serves as an anti-reflection coating (ARC) layer. As shown in FIG. 19, a photolithographic process is then performed to define a pattern of a plurality of gates in the photoresist layer 94 above the P-well 70 and the N-well 68 of the periphery circuit region 64. Next, the pattern of the photoresist layer 94 is used as a hard mask to etch the undoped polysilicon layer 76 in the periphery circuit region 64 down to the surface of the dielectric layer 74 so as to form gates 93, 95 for each MOS transistor in the periphery circuit region 64.

Figure 20:
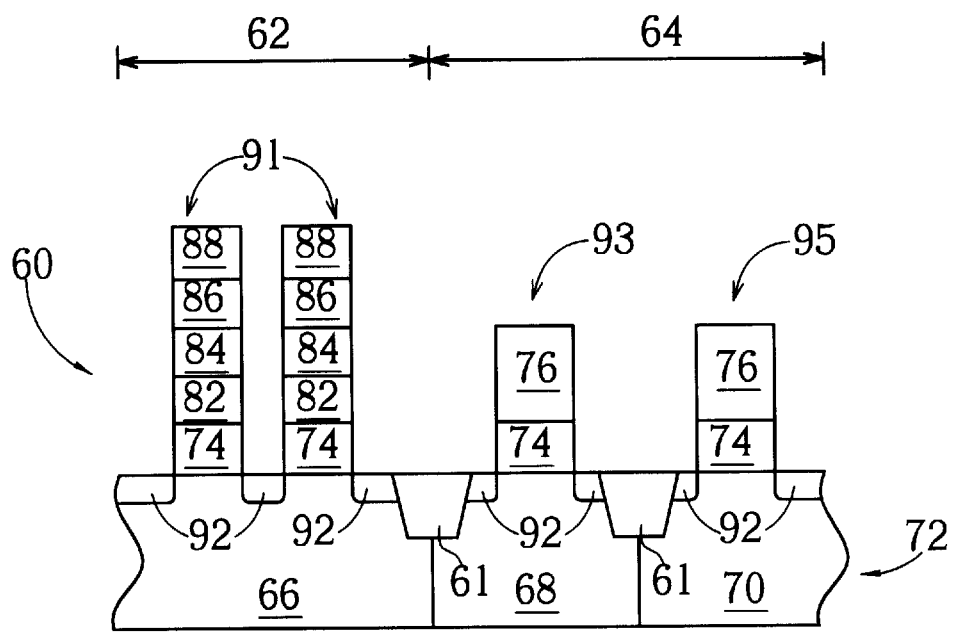
Figure 21:
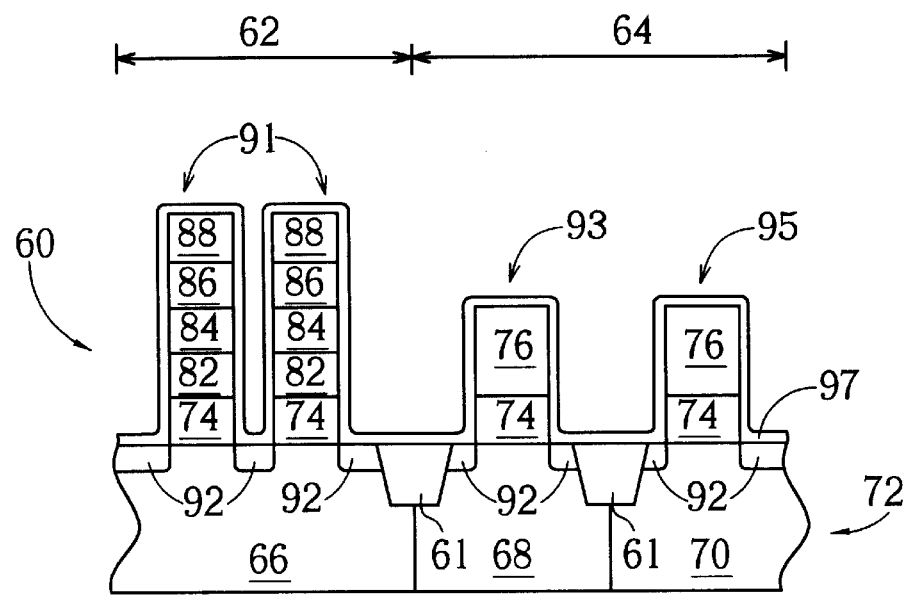
Figure 22:
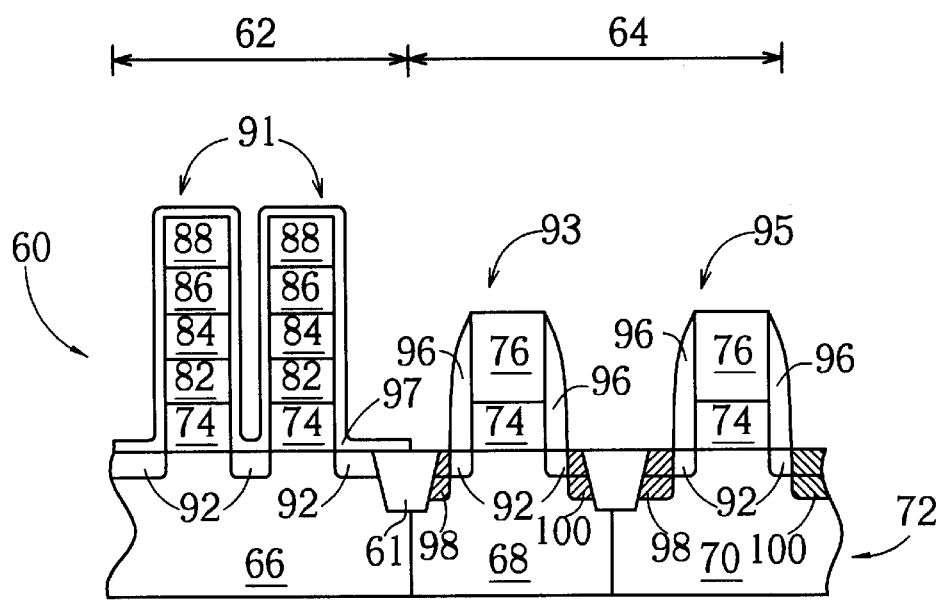

As shown in FIG. 20, an ion implantation process is performed to form lightly doped drains (LDD) 92 for each MOS transistor in the periphery circuit region 64. After removing the photoresist layer 94, a silicon nitride layer 97 is formed on the surface of the semiconductor wafer 60 to cover the surface of each gate 91, 93 and 95, as shown in FIG. 21. Then, as shown in FIG. 22, a photoresist layer (not shown) and a photolithographic process are used to define the mask pattern. The mask pattern is used to etch portions of the silicon nitride layer 97 around each gate 93, 95 in the periphery circuit region 64 so as to form spacers 96. Next, an ion implantation process is performed to form sources 98 and drains 100 of the MOS transistor in the periphery circuit region 64.

Figure 23:
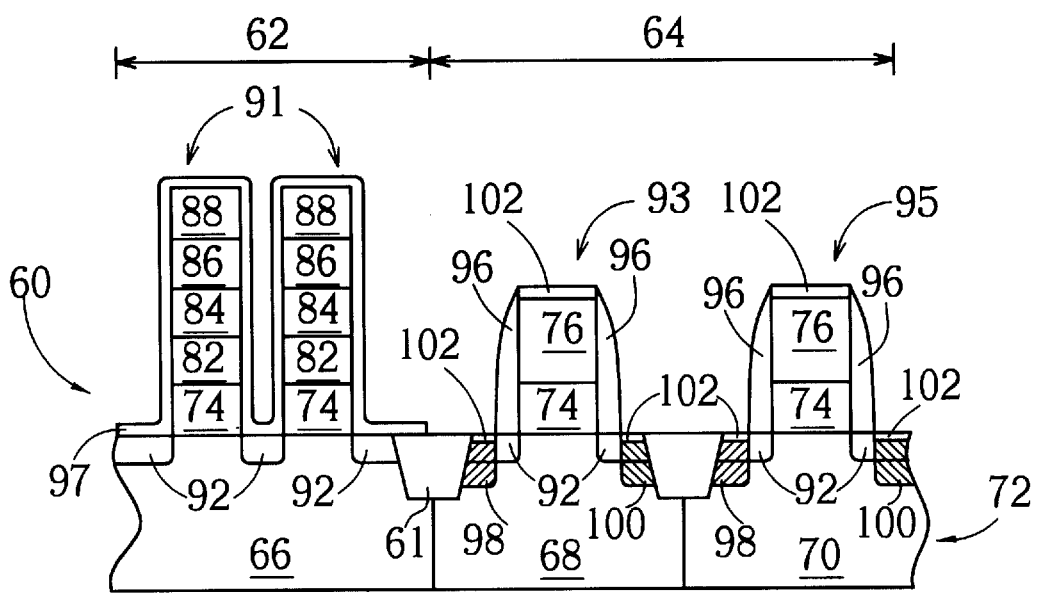

After the formation of the sources 98 and the drains 100 of each MOS transistor in the periphery circuit region 64, a metal layer (not shown), made of Co, is formed on the surface of the semiconductor wafer 60, as shown in FIG. 23. The metal layer covers the surfaces of the sources 98, the drains 100, and the gates 93, 95 in the periphery circuit region 64. Then, a first rapid thermal process (RTP) is performed at a temperature between 400° C. and 600° C. for a duration of 10 to 50 seconds. As a result, a salicide layer 102 is formed on the surfaces of each source 98, drain 100 and gates 93, 95 in the periphery circuit region 64. A wet etching process is performed to remove the portions of the metal layer that do not react with the surface on the semiconductor wafer 60. Finally, a second rapid thermal process (RTP) is performed at a temperature between 600° C. to 800° C. for a duration of 10 to 50 seconds, leading to the $Co_2Si$ and $CoS$ of the salicide layer 102 to react to form $CoSi_2$, which has a lower resistance. Co can also be replaced by other metals such as Ti, Ni, or Mo to form the metal layer.

Figure 24:
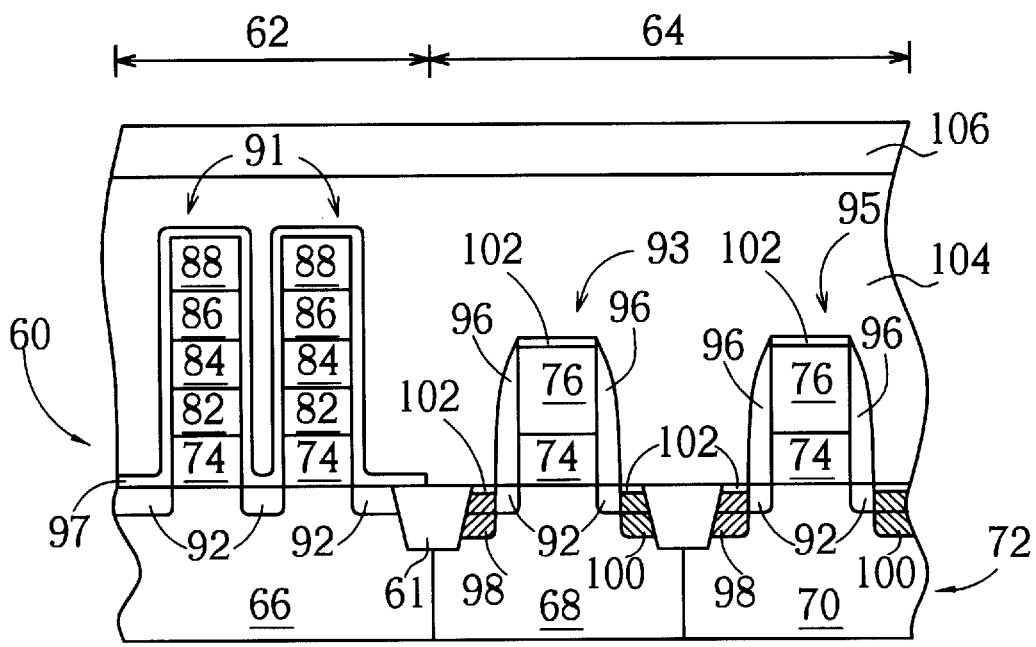
Figure 25:
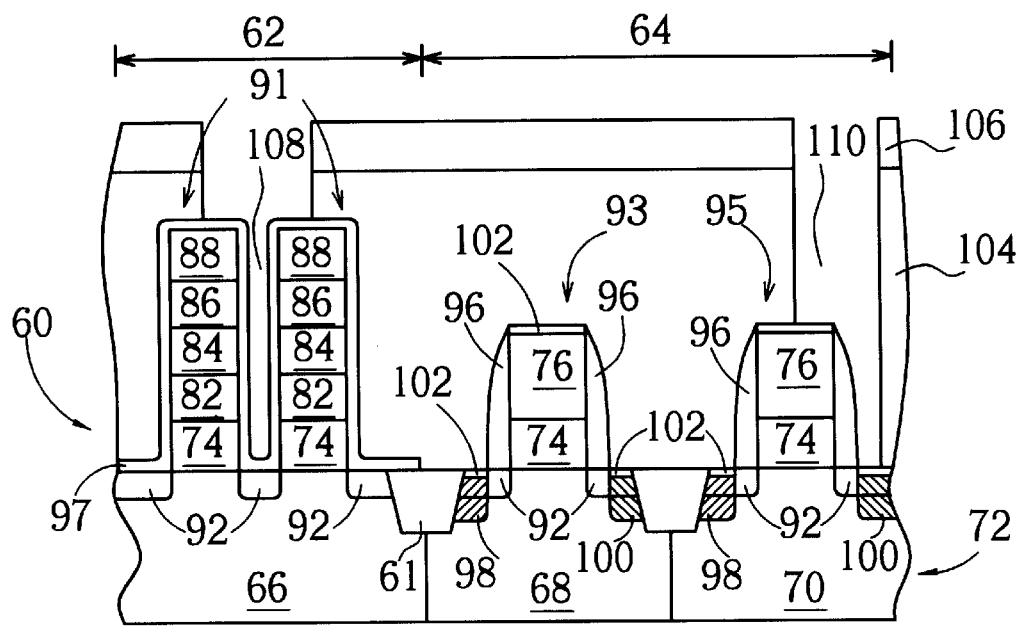
Figure 26:
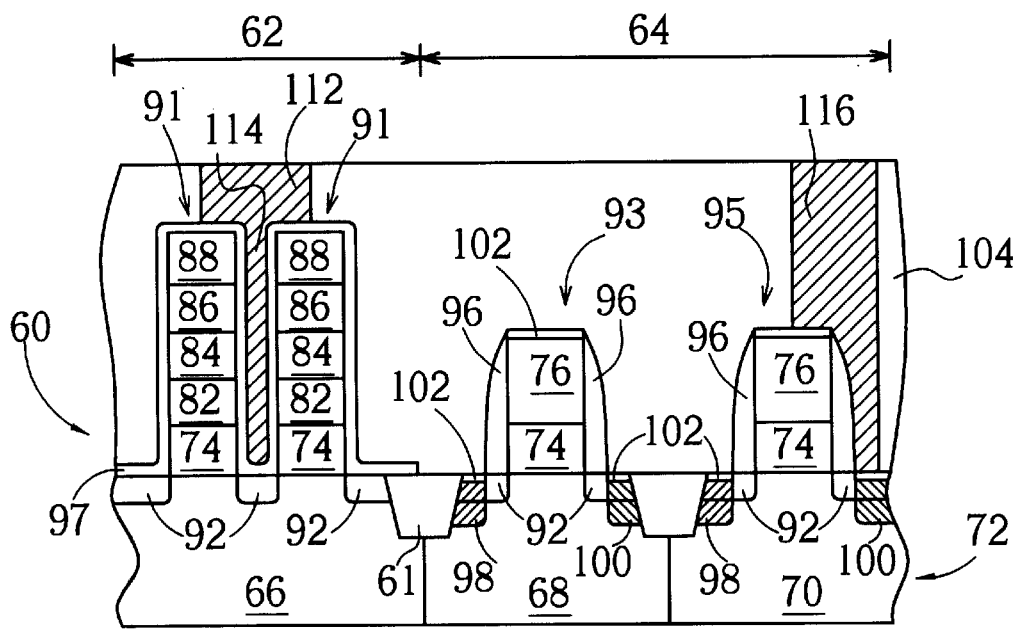

As shown in FIG. 24, a dielectric layer 104 and a photoresist layer 106 are formed, respectively, on the surface of semiconductor wafer 60. A photolithographic process is then performed to define a pattern of a landing via and strip contact in the photoresist layer 106. Then, the pattern of the photoresist layer 106 is used as a hardmask to etch the dielectric layer 104. Thus, a landing via hole 108 is formed in the dielectric layer 104 in the memory array region 62, and a strip contact hole 110 is formed in-situ in the dielectric layer 104 in the periphery circuit region 64, as shown in FIG. 25. Since the strip contact hole 110 is connected to the gate 95 and source or drain of another MOS transistor, the strip contact hole 110 and gate 95is thus located in different vertical planes. Finally, as shown in FIG. 26, a conductive layer 112 fills into the landing via hole 108 and the strip contact hole 110 to form in-situ each landing via 114 and strip contact 116.

In contrast to the prior art method for fabricating a landing via and strip contact of an embedded memory, the fabricating method according to the present invention integrates the process of manufacturing an embedded memory and the sequential process of forming a landing via and a strip contact in the embedded memory. Both a landing via and a strip contact are in-situ formed so as to reduce the complexity and the cost of the process. Moreover, the strip contact of the present invention uses a conductive line to connect the neighboring gate with the source or drain, to largely decrease the occupied space of the strip contact and reduce the volume of the memory device and increase integration.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for simultaneously fabricating a landing via and a strip contact of an embedded memory, the method comprising:

providing a semiconductor wafer with both a memory array region and a periphery circuit region defined on the surface of the silicon substrate of the semiconductor wafer;

forming a first dielectric layer, an undoped polysilicon layer, and a second dielectric layer, respectively, on the surface of the semiconductor wafer;

implanting the undoped polysilicon layer in the memory array region so as to change the undoped polysilicon layer above the memory array region to a doped polysilicon layer;

removing the second dielectric layer in the memory array region and etching the doped polysilicon layer to a predetermined depth;

forming a silicide layer, a protection layer, and a first photoresist layer, respectively, on the surface of the semiconductor wafer;

defining a pattern of a plurality of gates in the first photoresist layer in the memory array region, using the pattern of the first photoresist layer as a hard mask to etch the protection layer, the silicide layer, and the doped polysilicon layer located in the memory array region down to the surface of the first dielectric layer, as well as in-situ etching of the protection layer and the silicide layer located in the periphery circuit region down to the surface of the second dielectric layer;

forming a lightly doped drain (LDD) adjacent to each gate in the memory array region;

removing the first photoresist layer and the second dielectric layer in the periphery circuit region;

forming a second photoresist layer on the surface of the semiconductor wafer;

defining a pattern of a plurality of gates in the second photoresist layer in the periphery circuit region;

using the pattern of the second photoresist layer as a hard mask to etch the undoped polysilicon layer in the periphery circuit region down to the surface of the first dielectric layer so as to form each gate in the periphery circuit region;

forming a lightly doped drain (LDD) adjacent to each gate in the periphery circuit region;

removing the second photoresist layer;

forming a silicon nitride on the surface of the semiconductor and covering each surface of the gate;

removing portions of silicon nitride in the periphery circuit region, to form a spacer on either side of the gate in the periphery circuit region;

forming a third dielectric layer and a third photoresist layer on the surface of semiconductor wafer, respectively;

defining a pattern of the landing via and the strip contact in the third photoresist layer;

using the pattern of the third photoresist layer as a hard mask to etch the third dielectric layer, to form a landing via hole in the third dielectric layer in the memory array region, and in-situ to form a strip contact hole in the third dielectric layer in the periphery circuit region; and filling each landing via hole and strip contact hole with a conductive layer, so as to form in-situ each landing via and strip contact.

2. The method of claim 1 wherein the first dielectric layer is composed of silicon dioxide ($SiO_2$) and serves as the gate oxide layer for each gate.

3. The method of claim 1 wherein the predetermined depth is approximately half the total depth of the undoped polysilicon layer.

4. The method of claim 1 wherein the protection layer is composed of silicon nitride, and a silicon-oxy-nitride ($SiO_xN_y$) layer that serves as an anti-reflection coating (ARC) layer is positioned between the protection layer and the silicide layer 6.

5. The method of claim 1 wherein a silicon-oxy-nitride ($SiO_xN_y$) layer, serving as an anti-reflection coating (ARC) layer, is formed on the surface of the semiconductor wafer prior to the formation of the second photoresist layer on the surface of the semiconductor wafer.

6. The method of claim 5 wherein after the second photoresist layer is removed, the silicon-oxy-nitride ($SiO_xN_y$) layer located underneath the second photoresist layer is also removed.

7. The method of claim 1 wherein each spacer is formed on either side of each gate in the periphery circuit region, the method also comprises forming a source and drain adjacent to each gate in the periphery circuit region.

8. The method of claim 7 wherein after the formation of the source and the drains the method also comprises:
   forming a metal layer on the surface of the semiconductor wafer, the metal layer covering the surface of each source, drain, and gate in the periphery circuit region;
   performing a first rapid thermal process (RTP);
   removing the portions of the metal layer that do not react with the surface of the semiconductor wafer; and
   performing a second rapid thermal process (RTP).

9. The method of claim 8 wherein the metal layer is composed of cobalt (Co), titanium(Ti), nickel(Ni), or molybdenum (Mo).

10. A method for in-situ fabricating a landing via and strip contact of an embedded memory, the method comprising:
   providing a semiconductor wafer with both a memory array region and a periphery circuit region defined on the surface of the silicon substrate of the semiconductor wafer, with the memory array region comprising at least a cell-well, and the periphery circuit region comprising at least a N-well and a P-well;
   forming a first dielectric layer, an undoped polysilicon layer, and a second dielectric layer, respectively, on the surface of the semiconductor wafer;
   implanting the undoped polysilicon layer in the memory array region so as to change the undoped polysilicon layer in the memory array region to a doped polysilicon layer;
   removing the second dielectric layer in the memory array region and etching the doped polysilicon layer to a predetermined depth;
   forming a silicide layer, a protection layer, and a first photoresist layer, respectively, on the surface of the semiconductor wafer;
   defining a pattern of a plurality of gates in the first photoresist layer above the cell-well of the memory array region;
   using the pattern of the first photoresist layer as a hard mask to etch the protection layer, the silicide layer, and the doped polysilicon layer in the memory array region down to the surface of the first dielectric layer, as well as an in-situ etching of the protection layer and the silicide layer in the periphery circuit region down to the surface of the second dielectric layer;
   removing the first photoresist layer;
   forming a lightly doped drain (LDD) adjacent to each gate in the memory array region;
   removing the first photoresist layer and the second dielectric layer in the periphery circuit region;
   forming a second photoresist layer on the surface of the semiconductor wafer;
   defining a pattern of a plurality of gates in the second photoresist layer above the N-well and the P-well of the periphery circuit region;
   using the pattern of the second photoresist layer as a hard mask to etch the undoped polysilicon layer in the periphery circuit region down to the surface of the first dielectric layer so as to form each gate in the periphery circuit region;
   removing the second photoresist layer;
   form a lightly doped drain (LDD) adjacent to each gate in the periphery circuit region;
   forming a silicon nitride on the surface of the semiconductor and covering the surface of each gate;
   removing portions of silicon nitride on the periphery circuit region, to form a spacer on either side of each gate in the periphery circuit region;
   forming a third dielectric layer and a third photoresist layer on the surface of semiconductor wafer, respectively; defining a pattern of a landing via and strip contact in the third photoresist layer;
   using the pattern of the third photoresist layer as a hard mask to etch the third dielectric layer, so as to form a landing via hole in the third dielectric layer in the memory array region, and to form in-situ a strip contact hole in the third dielectric layer in the periphery circuit region; and
   filling each landing via hole and strip contact hole with a conductive layer, so as to form in-situ each landing via and strip contact.

11. The method of claim 10 wherein the first dielectric layer is composed of silicon dioxide ($SiO_2$) and serves as the gate oxide layer for each gate.

12. The method of claim 10 wherein the predetermined depth is approximately half of the total depth of the undoped polysilicon layer.

13. The method of claim 11 wherein the protection layer is composed of silicon nitride, and a silicon-oxy-nitride ($SiO_xN_y$) layer that serves as an anti-reflection coating (ARC) layer is positioned between the protection layer and the silicide layer.

14. The method of claim 10 wherein a silicon-oxy-nitride ($SiO_xN_y$) layer, serving as an anti-reflection coating (ARC) layer, is formed on the surface of the semiconductor wafer prior to the formation of the second photoresist layer on the surface of the semiconductor wafer.

15. The method of claim 14 wherein after the second photoresist layer is removed, the silicon-oxy-nitride ($SiO_xN_y$) layer located underneath the second photoresist layer is also removed.

16. The method of claim 10 wherein each spacer is formed on either side of each gate in the periphery circuit region, the method also comprises:
   forming a source and drain adjacent to each gate above the P-well and N-well of the periphery circuit region.

17. The method of claim 16 wherein after the formation of the source and the drain, the method also comprises:
   forming a metal layer on the surface of the semiconductor wafer, the metal layer covering the surface of each source, drain, and gate in the periphery circuit region;
   performing a first rapid thermal process (RTP);
   removing the portions of the metal layer that do not react with the surface of the semiconductor wafer; and
   performing a second rapid thermal process (RTP).

18. The method of claim 14 wherein the metal layer is composed of cobalt (Co), titanium(Ti), nickel(Ni), or molybdenum (Mo).

* * * * *